(12) United States Patent
Lee et al.

(10) Patent No.: US 11,088,237 B2
(45) Date of Patent: Aug. 10, 2021

(54) SELF-LIGHT EMITTING DISPLAY DEVICE

(71) Applicant: LG Display Co., Ltd., Seoul (KR)

(72) Inventors: Seungbum Lee, Gimpo-si (KR); Wonrae Kim, Paju-si (KR); Sooin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/586,953

(22) Filed: Sep. 28, 2019

(65) Prior Publication Data

US 2020/0105855 A1 Apr. 2, 2020

(30) Foreign Application Priority Data

Sep. 28, 2018 (KR) .................. 10-2018-0116091

(51) Int. Cl.
*H01L 27/32* (2006.01)
*H01L 51/52* (2006.01)

(52) U.S. Cl.
CPC ........ *H01L 27/3274* (2013.01); *H01L 27/322* (2013.01); *H01L 27/3211* (2013.01); *H01L 27/3244* (2013.01); *H01L 51/5206* (2013.01); *H01L 51/5221* (2013.01); *H01L 51/5284* (2013.01)

(58) Field of Classification Search
CPC ............. H01L 27/3274; H01L 51/5221; H01L 51/5206; H01L 27/322; H01L 51/5284; H01L 2251/558; H01L 27/3211; H01L 27/3244

See application file for complete search history.

(56) References Cited

U.S. PATENT DOCUMENTS

| | | | | |
|---|---|---|---|---|
| 9,202,855 | B1* | 12/2015 | Jo | H01L 27/3211 |
| 2003/0186078 | A1* | 10/2003 | Murata | H01L 27/3211 |
| | | | | 428/690 |
| 2004/0195963 | A1* | 10/2004 | Choi | H01L 27/3213 |
| | | | | 313/504 |
| 2005/0062407 | A1* | 3/2005 | Suh | H01L 27/322 |
| | | | | 313/504 |
| 2006/0152151 | A1* | 7/2006 | Seo | H01L 27/322 |
| | | | | 313/506 |
| 2008/0001528 | A1* | 1/2008 | Eida | H01J 29/898 |
| | | | | 313/501 |
| 2008/0081105 | A1* | 4/2008 | Suh | B05D 5/12 |
| | | | | 427/58 |

(Continued)

FOREIGN PATENT DOCUMENTS

| | | |
|---|---|---|
| KR | 10-2012-0111912 A | 10/2012 |
| KR | 10-2017-0019510 A | 2/2017 |

*Primary Examiner* — Ahmed N Sefer
(74) *Attorney, Agent, or Firm* — Polsinelli PC

(57) ABSTRACT

A self-light emitting display device comprises a circuit board including a driving thin-film transistor; a cathode; an organic film disposed between the circuit board and the cathode; an anode disposed between the circuit board and the organic film; and a color filter disposed between the circuit board and the anode and including a first color filter unit, a second color filter unit, and a third color filter unit; wherein the third color filter unit has a portion disposed between the first color filter unit and the second color filter unit, and wherein the third color filter unit is thicker than the first color filter unit and the second color filter unit.

13 Claims, 4 Drawing Sheets

(56) References Cited

U.S. PATENT DOCUMENTS

| | | | |
|---|---|---|---|
| 2010/0026178 A1* | 2/2010 | Hwang | H01L 51/5265 |
| | | | 313/506 |
| 2014/0009905 A1* | 1/2014 | Kobayashi | H01L 27/322 |
| | | | 362/84 |
| 2018/0182815 A1* | 6/2018 | Choi | H01L 27/3258 |

* cited by examiner

SELF-LIGHT EMITTING DISPLAY DEVICE

CROSS-REFERENCE TO RELATED APPLICATION

This application claims priority to and the benefit of Korean Patent Application No. 10-2018-0116091 filed on Sep. 28, 2018, which is hereby incorporated by reference in its entirety.

BACKGROUND

Field of the Disclosure

The present disclosure relates to a self-light emitting display device.

Description of Background

Self-light emitting display devices are display devices which emit light on their own.

A display device is a device that can display data visually. In an information society, there is a growing need for various types of display devices which can display images. A liquid crystal display (LCD), and an organic light-emitting diode display device (OLED) have been widely used as a display device.

The organic light-emitting diode display device displays an image using an organic light-emitting device.

The organic light-emitting device is a self-light emitting display device which converts electric energy into light energy using an organic material. In general, the organic light-emitting device has a structure in which an organic film is placed between an anode and a cathode. When driving voltage is supplied between the anode and the cathode, holes are injected through the anode and electrons are injected through the cathode. When the holes and the electrons meet in the organic film, excitons are generated. When the state of the excitons is turned into a floor state, light is emitted.

The organic film has a structure in which layers consisting of different materials are stacked to enhance efficiency and safety of the organic light-emitting device. For instance, the organic film may include a hole injection layer, a hole transport layer, a light-emitting layer, an electron transport layer, an electron injection layer and the like.

The display device may include a color filer to display colors.

The color filter is an optical component which transmits light in a range of predetermined color wavelengths among light coming from a light source and which absorbs light outside the range of predetermined color wavelengths. For instance, the color filter may transmit light in a range of red wavelengths, light in a range of green wavelengths, and light in a range of blue wavelengths and may absorb light outside the ranges of red wavelengths, green wavelengths and blue wavelengths. Accordingly, the color filter may absorb light except for light in a range of predetermined color wavelengths which will be displayed, thereby reducing light transmittance or luminous efficiency.

SUMMARY

The present disclosure provided a self-light emitting display device which can prevent colors of adjacent sub-pixels from being mixed.

In addition, the present disclosure provides a self-light emitting display device which can reduce reflectivity.

Problems that may be solved by the present disclosure are not limited to what has been described. Additionally, other problems that have not been mentioned may be clearly understood from the following description by one having ordinary skill in the art to which the disclosure pertains.

Aspects disclosed herein provide a self-light emitting display device that includes a circuit board including a driving thin-film transistor, a cathode, an anode, an organic film, and a color filter. The organic film is placed between the circuit board and the cathode. The anode is placed between the circuit board and the organic film, and the color filter is placed between the circuit board and the anode.

The color filter includes a first color filter unit, a second color filter unit, and a third color filter unit. A portion of the third color filter unit is placed between the first color filter unit and the second color filter unit. The third color filter unit is thicker than the first color filter unit and the second color filter unit and includes a contact hole. The anode electrically connects with the driving thin-film transistor through the contact hole.

The self-light emitting display device may further include a color conversion layer. The color conversion layer may be placed between the color filter and the anode and includes a first color conversion unit and a second color conversion unit. The first color conversion unit is placed above the first color filter unit, and the second color conversion unit may be placed above the second color filter unit. Another portion of the third color filter unit may be placed between the first color conversion unit and the second color conversion unit.

The first color filter unit may be a red filter unit, and the first color conversion unit may be a red conversion unit. The second color filter unit may be a green filter unit, and the second color conversion unit may be a green conversion unit. The third color filter unit may be a blue filter unit.

Details of other aspects are included in the detailed description and the drawings.

The self-light emitting display device according to the present disclosure may reduce the possibility that colors of adjacent sub-pixels may be mixed.

The self-light emitting display device according to the present disclosure may reduce reflectivity.

Effects of the present disclosure are not limited to the effects that have been described above. Additionally, various effects are included in the present disclosure.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION OF THE DISCLOSURE

Figure 1:
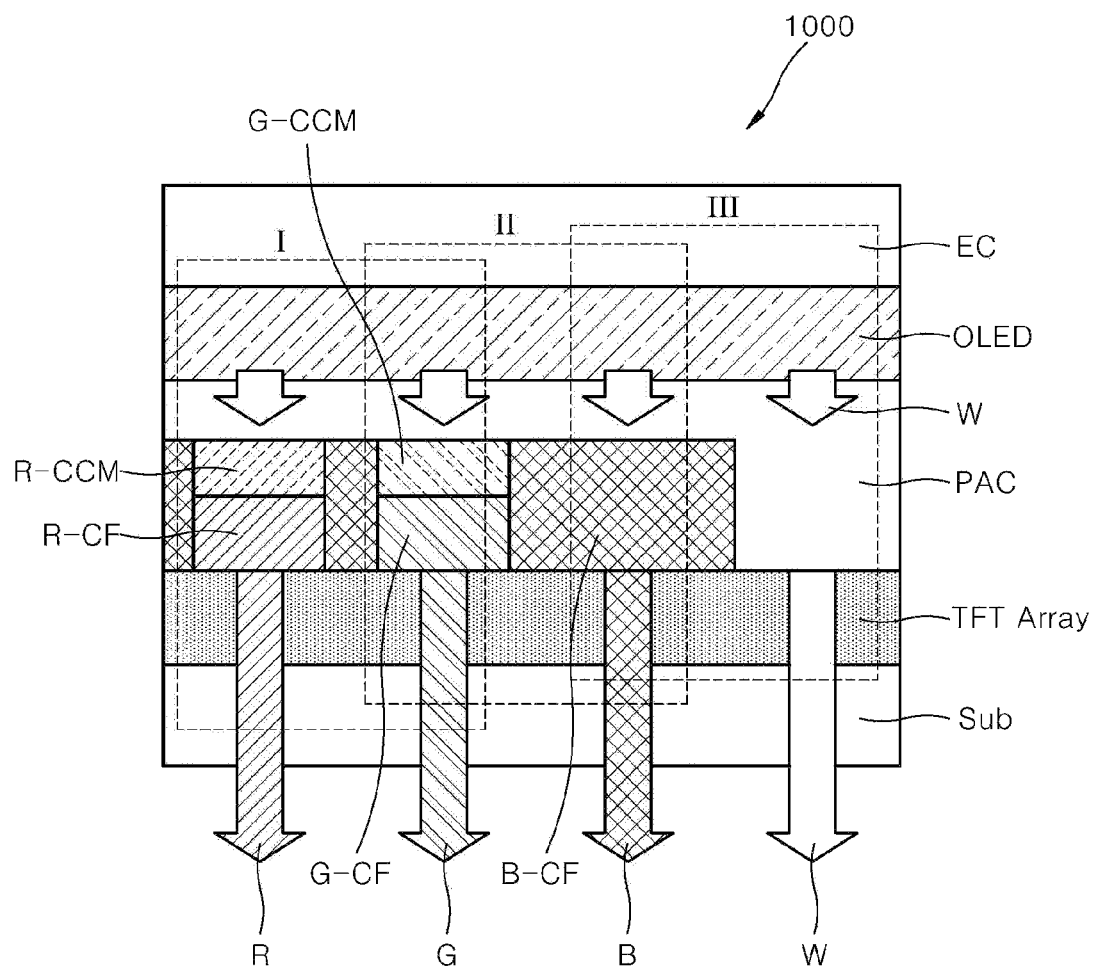
FIG. 1 is a schematic view illustrating a self-light emitting display device according to the present disclosure.

Advantages and features of the present disclosure, and methods for implementing the same may be understood clearly by reference to the following description of aspects and experimental examples together with the attached drawings. The attached drawings are provided so that the technical spirit of the present disclosure can be readily understood. Therefore, the technical spirit should not be construed as being limited to the attached drawings.

Additionally, the inventive subject matter may be embodied in various different forms. Accordingly, the disclosure should not be construed as being limited to what is disclosed below. Rather, what is disclosed below is presented so that the disclosure can be thorough and complete and can fully convey the scope of the inventive subject matter to one having ordinary skill in the art. The present disclosure should be defined only according to the scope of the appended claims.

Detailed description of relevant technologies that are publicly known may be omitted if it is deemed to make the gist of the present disclosure unnecessarily vague.

The terms "first", "second" and the like are used herein to describe various elements. However, the terms are used only to distinguish one element from another element. Thus, the elements should not be limited by the terms. Unless otherwise described, a first element may be a second element.

Throughout the specification, the singular forms "a", "an" and "the" are intended to include the plural forms as well, unless otherwise described.

Throughout the specification, the terms "including", and "having" should imply the inclusion of any other element but not the exclusion of any other element, unless otherwise described.

Throughout the specification, the terms "A and/or B" imply A, B, or A and B, and the terms "C to D" imply C or more and D or less, unless otherwise described.

When an element or a layer is described as being "on" another element or "on" another layer, the element or the layer may be "directly on" or "right on" another element or another layer, and a third element or a third layer may be interposed between the element and another element or between the layer and another layer. However, when an element or a layer is described as being "directly on" another element or another layer, or being "right on" another element or another layer, a third element or a third layer is not interposed between the element and another element or between the layer and another layer.

Spacial terms such as "below", "beneath", "lower", "above", "upper" and the like may be used to readily describe a relationship between one element or elements and another element or elements, as illustrated in the drawings. Additionally, the spacial terms should be interpreted as including different directions in which the elements are used or operate in addition to the directions in the drawings.

Below, the present disclosure is described with reference to the attached drawings.

FIG. 1 is a mimetic view illustrating a self-light emitting display device 1000 according to the present disclosure.

The self-light emitting display device 1000 includes a display area in which each of the pixels is arranged in a matrix form, and a non-display area that is placed around the display area. The display area is an area in which an image or information, generated in the self-light emitting display device 1000, is visible to a viewer. The non-display area is an area outside the display area and is an area in which an image or information, generated in the self-light emitting display device 1000, is not visible to a viewer. The non-display area may be referred to as a bezel area. The self-light emitting display device 1000 includes a plurality of pixels.

FIG. 1 illustrates a single pixel among a plurality of pixels which are provided in the self-light emitting display device 1000.

A pixel may be divided into sub-pixels. The sub-pixels may be classified into a first sub-pixel, a second sub-pixel, a third sub-pixel, and a fourth sub-pixel. For instance, the first sub-pixel may be a red pixel, the second sub-pixel may be a green pixel, the third sub-pixel may be a blue pixel, and the fourth sub-pixel may be a white pixel.

The self-light emitting display device 1000 includes an upper encapsulation substrate (EC), an organic light-emitting device (OLED) and a lower substrate, for each pixel. The organic light-emitting device (OLED) is disposed between the upper encapsulation substrate (EC) and the lower substrate. The lower substrate includes a circuit board and a color layer that is disposed above the circuit board. The circuit board includes a substrate (Sub) and a thin-film transistor array (TFT Array) that is disposed above the substrate (Sub). The color layer includes a color filter that is disposed above the thin-film transistor array (TFT Array), and a color conversion layer that is disposed above the color filter. The self-light emitting display device 1000 further includes a passivation film (PAC) that flattens a surface of the lower substrate and that is disposed between the lower substrate and the organic light-emitting device (OLED). The color layer and the passivation film (PAC) are disposed between the circuit board and the organic light-emitting device (OLED).

The organic light-emitting device (OLED) outputs white light (W) to the passivation film (PAC). The white light (W) is input to the color conversion layer via the passivation film (PAC), and the color conversion layer converts short-wavelength light among the input light into long-wavelength light and outputs the long-wavelength light. The long-wavelength light that is output from the color conversion layer is input to the color filter, and the color filter only transmits light in a range of specific wavelengths optionally among the input light and absorbs light outside the range of specific wavelengths. The self-light emitting display device 1000 may implement colors using light that passes through the color filter.

The upper encapsulation substrate (EC) is disposed above the organic light-emitting device (OLED), and may prevent external moisture or external air and the like from infiltrating the organic light-emitting device (OLED) and protect the organic light-emitting device (OLED) from an external impact.

The color filter is disposed above the thin-film transistor array (TFT Array), and includes a first color filter unit (R-CF), a second color filter unit (G-CF), and a third color filter unit (B-CF). For instance, the first color filter unit (R-CF) may be a red filter unit that is disposed in a red pixel, the second color filter unit (G-CF) may be a green filter unit that is disposed in a green pixel, and the third color filter unit (B-CF) may be a blue filter unit that is disposed in a blue pixel.

The third color filter unit (B-CF) is thicker than the first color filter unit (R-CF) and the second color filter unit (G-CF), and for instance, may be twice or more as thick as the first color filter unit (R-CF) and the second color filter unit (G-CF). A first part of the third color filter unit (B-CF) may be disposed between the first color filter unit (R-CF) and the second color filter unit (G-CF), and a second part of the third color filter unit (B-CF) may be disposed between a first color conversion unit (R-CCM) and a second color conversion unit (G-CCM). The second part of the third color filter unit (B-CF) connects with the first part of the third color filter unit (B-CF).

The color conversion layer is disposed above the color filter, and includes the first color conversion unit (R-CCM) that is disposed above the first color filter unit (R-CF), and the second color conversion unit (G-CCM) that is disposed above the second color filter unit (G-CF). For instance, the first color conversion unit (R-CCM) may be a red conversion unit that is disposed in a red pixel and that converts input light into light in a range of red wavelengths, i.e., red light, and the second color conversion unit (G-CCM) may be a green conversion unit that converts input light into light in a range of green wavelengths, i.e., green light.

The passivation film (PAC) includes a first region, a second region and a third region. The first region, the second region and the third region connect to one another. The first region is disposed to be overlapped with a red pixel and a green pixel. The first region is disposed above the first color conversion unit (R-CCM) in the red pixel and is disposed above the second color conversion unit (G-CCM) in the green pixel. The second region is disposed above the third color filter unit (B-CF). The third region is disposed above the thin-film transistor array (TFT Array) and is thicker than the third color filter unit (B-CF), in a white pixel.

On the assumption that the first color filter unit (R-CF) is a red filter unit that is disposed in a red pixel, that the second color filter unit (G-CF) is a green filter unit that is disposed in a green pixel, and that the third color filter unit (B-CF) is a blue filter unit that is disposed in a blue pixel, the first color filter unit (R-CF), the second color filter unit (G-CF), and the third color filter unit (B-CF) are described below.

The first color filter unit (R-CF) only transmits light in a range of red wavelengths and for instance, absorbs light in a range of green wavelengths and light in a range of blue wavelengths. The first color filter unit (R-CF) includes pigment red. Pigment red is not restricted. For instance, pigment red may be C.I. pigment red 177, C.I. pigment red 254, C.I. pigment red 7, C.I. pigment red 9, C.I. pigment red 14, C.I. pigment red 41, C.I. pigment red 81, C.I. pigment red 97, C.I. pigment red 122, C.I. pigment red 123, C.I. pigment red 146, C.I. pigment red 149, C.I. pigment red 155, C.I. pigment red 166, C.I. pigment red 168, C.I. pigment red 169, C.I. pigment red 176, C.I. pigment red 178, C.I. pigment red 180, C.I. pigment red 184, C.I. pigment red 185, C.I. pigment red 187, C.I. pigment red 192, C.I. pigment red 200, C.I. pigment red 220, C.I. pigment red 223, C.I. pigment red 224, C.I. pigment red 226, C.I. pigment red 227, C.I. pigment red 228, C.I. pigment red 240, C.I. pigment red 242, C.I. pigment red 246, C.I. pigment red 255, C.I. pigment red 264, C.I. pigment red 270, C.I. pigment red 272, C.I. pigment red 273, C.I. pigment red 276, or C.I. pigment red 277 and the like.

The second color filter unit (G-CF) only transmits light in a range of green wavelengths and for instance, absorbs light in a range of red wavelengths and light in a range of blue wavelengths. The second color filter unit (G-CF) includes pigment green. Pigment green is not restricted. For instance, pigment green may be a phthalocyanine-based compound such as C.I. pigment green 7, or C.I. pigment green PG36 and the like.

The third color filter unit (B-CF) only transmits light in a range of blue wavelengths and for instance, absorbs light in a range of red wavelengths and light in a range of green wavelengths. The third color filter unit (B-CF) includes pigment blue. Pigment blue is not restricted. For instance, pigment blue may be C.I. pigment blue 15, C.I. pigment blue 15:1, C.I. pigment blue 15:2, C.I. pigment blue 15:3, C.I. pigment blue 15:4, C.I. pigment blue 15:6, C.I. pigment blue 16, C.I. pigment blue 22, C.I. pigment blue 60, or C.I. pigment blue 64 and the like.

The first color filter unit (R-CF) and the second color filter unit (G-CF) are respectively formed in a red pixel and a green pixel and then the third color filter unit (B-CF) is formed in a blue pixel. By doing so, the color filter may be obtained. The order of forming the first color filter unit (R-CF) and the second color filter unit (G-CF) is not restricted. The first color filter unit (R-CF) may be formed before the second color filter unit (G-CF) is formed. The first color filter unit (R-CF) may be formed after the second color filter unit (G-CF) is formed.

Red photoresist liquid is applied onto the thin-film transistor array (TFT Array) and then a red photoresist film is patterned. By doing so, the first color filter unit (R-CF) may be obtained. Green photoresist liquid is applied onto the thin-film transistor array (TFT Array) and then a green photoresist film is patterned. By doing so, the second color filter unit (G-CF) may be obtained. The first color filter unit (R-CF) and the second color filter unit (G-CF) may be spaced apart from each other. For instance, each of the red photoresist film and the green photoresist film may be patterned through the process of photolithography.

Blue photoresist liquid is applied in the entire region of the thin-film transistor array (TFT Array) except for red, green and white pixels. By doing so, the third color filter unit (B-CF) may be obtained. In this case, a blue photoresist film is thicker than the first color filter unit (R-CF) and the second color filter unit (G-CF).

Space encircled by lateral walls that consist of the third color filter unit (B-CF) is created above each of the first color filter unit (R-CF) and the second color filter unit (G-CF). In the space, the first color conversion unit (R-CCM) and the second color conversion unit (G-CCM) may be respectively disposed. The third color filter unit (B-CF) may be serve as a mold for obtaining the first color conversion unit (R-CCM) and the second color conversion unit (G-CCM) using the technology of inkjet printing.

On the assumption that the first color conversion unit (R-CCM) is a red conversion unit and that the second color conversion unit (G-CCM) is a green conversion unit, the first color conversion unit (R-CCM) and the second color conversion unit (G-CCM) are described below.

Ink compositions containing color conversion materials fill each of the space disposed above of the first color filter unit (R-CF) and the space disposed above the second color filter unit (G-CF) and then the ink compositions are baked and cured. By doing so, the first color conversion unit (R-CCM) and the second color conversion unit (G-CCM) may be respectively obtained.

The color conversion materials, for instance, may be quantum dots, fluorescent dyes or a combination thereof. The fluorescent dyes, for instance, include organic fluorescent materials, inorganic fluorescent materials, and a combination thereof.

The quantum dot may be selected from II-VI compounds, III-V compounds, IV-VI compounds, IV elements, IV compounds and a combination thereof but not restricted. II-VI compounds may be selected from a group consisting of a binary compound that is selected from a group consisting of CdSe, CdTe, ZnS, ZnSe, ZnTe, ZnO, HgS, HgSe, HgTe, MgSe, MgS, and a combination thereof; a ternary compound that is selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound that is selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. III-V compounds may be selected from a group consisting of a binary compound that is selected from a group consisting of GaN, GaP, GaAs, GaSb, AN, AlP, AlAs, AlSb, InN, InP, InAs, InSb, and a combination thereof; a ternary compound that is selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary compound that is selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. IV-VI compounds may be selected from a group consisting of a binary compound that is selected from a group consisting of SnS, SnSe, SnTe, PbS, PbSe, PbTe, and a combination thereof; a ternary compound that is selected from a group consisting of SnSeS, SnSeTe, SnSTe, PbSeS, PbSeTe, PbSTe, SnPbS, SnPbSe, SnPbTe, and a combination thereof; and a quaternary compound that is selected from a group consisting of SnPbSSe, SnPbSeTe, SnPbSTe, and a combination thereof. IV elements may be selected from a group consisting of Si, Ge, and a combination thereof. IV compounds may be a binary compound that is selected from a group consisting of SiC, SiGe, and a combination thereof.

In this case, a particle may include a uniform concentration of the binary compound, the ternary compound, or the quaternary compound, or may include a different concentration of the binary compound, the ternary compound, or the quaternary compound. The Quantum dot may have a core/shell structure in which one quantum dot encircles another quantum dot. Interfaces of the core and shell may have a concentration gradient in which a concentration of elements becomes lower from the shell toward the core.

The quantum dot may have full width at half maximum (FWHM) of an emission spectrum, which is about 45 nm or less, preferably, about 40 nm or less and more preferably, about 30 nm or less. In this range, color purity or color reproduction may improve. Additionally, light that is emitted through the quantum dot is released in all directions. Accordingly, a range of light viewing angles may be expanded.

Further, types of quantum dots are not restricted. Specifically, the quantum dots may be any one of sphere-shaped quantum dots, pyramid-shaped quantum dots, and multi-arm-shaped quantum dots, or may be any one of cube-shaped nano particles, nano tube-shaped particles, nano wire-shaped particles, nano fiber-shaped particles, nano plate-shaped particles and the like.

The fluorescent dyes, for instance, may be red fluorescent dyes, green fluorescent dyes, dyes that emit a third color light, or a combination thereof. The red fluorescent dyes are a material that absorbs light in a range of green wavelengths and that emits light in a range of red wavelengths. The red fluorescent dyes, for instance, may be at least one of (Ca, Sr, Ba)S, (Ca, Sr, Ba)2Si5N8, CaAlSiN3, CaMoO4, and Eu2Si5N8. The green fluorescent dyes are a material that absorbs light in a range of blue wavelengths and that emits light in a range of green wavelengths. The green fluorescent dyes, for instance, may be at least one of yttrium aluminum garnet (YAG), (Ca, Sr, Ba)2SiO4, SrGa2S4, barium magnesium aluminate (BMA), α-SiAlON, β-SiAlON, Ca3Sc2Si3O12, Tb3Al5O12, BaSiO4, CaAlSiON, and (Sr1−xBax)Si2O2N2.

A transparent insulation material is applied onto the lower substrate after the color layer is formed. By doing so, the passivation film (PAC) may be obtained.

The first color conversion unit (R-CCM) converts a portion of white light (W) that is input via the first region of the passivation film (PAC) into red light (R), and outputs the red light (R) to the first color filter unit (R-CF). The first color filter unit (R-CF) only transmits red light (R) among the input light. As a result, the self-light emitting display device 1000 may implement a red color. The second color conversion unit (G-CCM) converts a portion of white light (W) that is input via the first region of the passivation film (PAC) into green light (G), and outputs the green light (G) to the second color filter unit (G-CF). The second color filter unit (G-CF) only transmits green light (G) among the input light. As a result, the self-light emitting display device 1000 may implement a green color. The third color filter unit (B-CF) only transmits blue light (B) among white light (W) that is input via the second region of the passivation film (PAC). As a result, the self-light emitting display device 1000 may implement a blue color. White light (W) that is input to the third region of the passivation film (PAC) is directly output to the thin-film transistor array (TFT Array).

Figure 2:
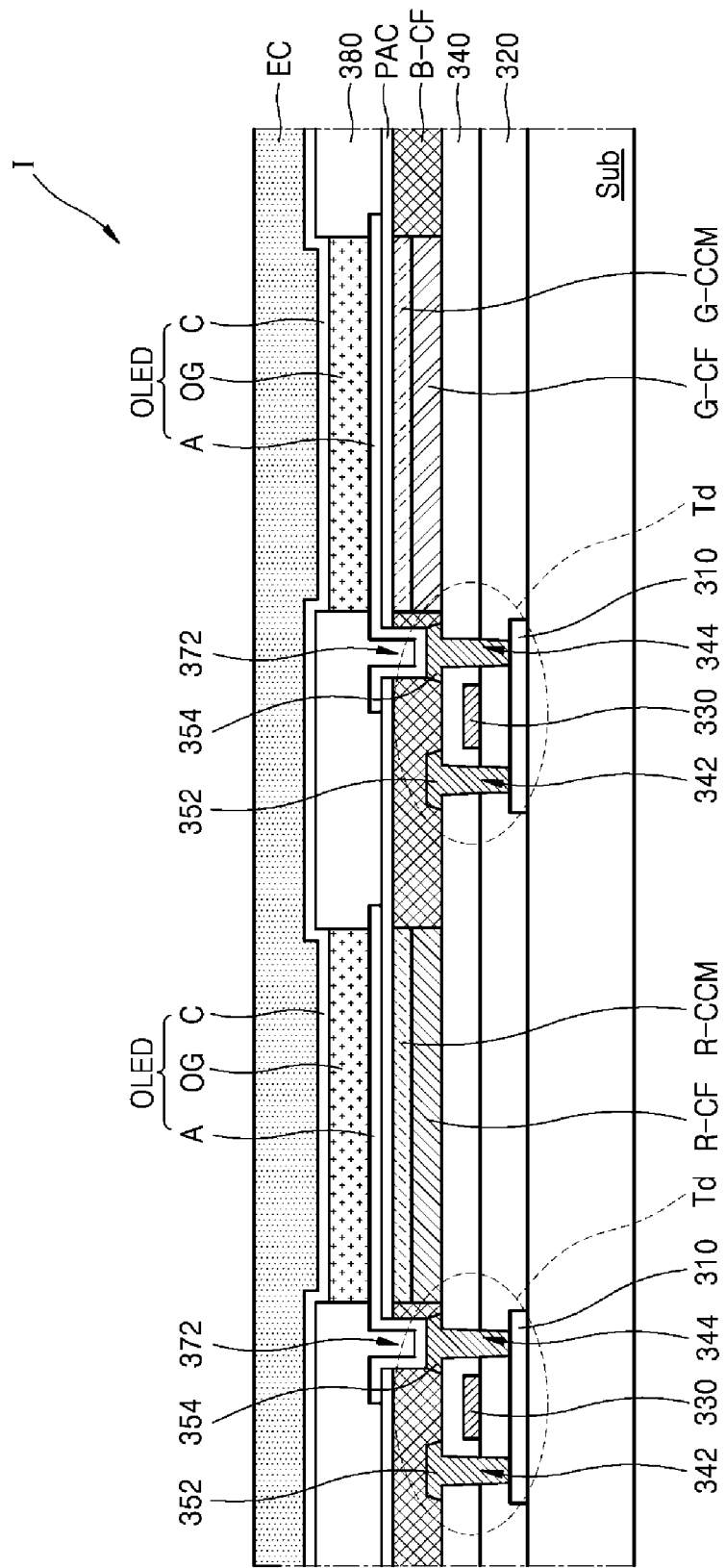
FIG. 2 is a schematic cross-sectional view illustrating region I in FIG. 1.
Figure 3:
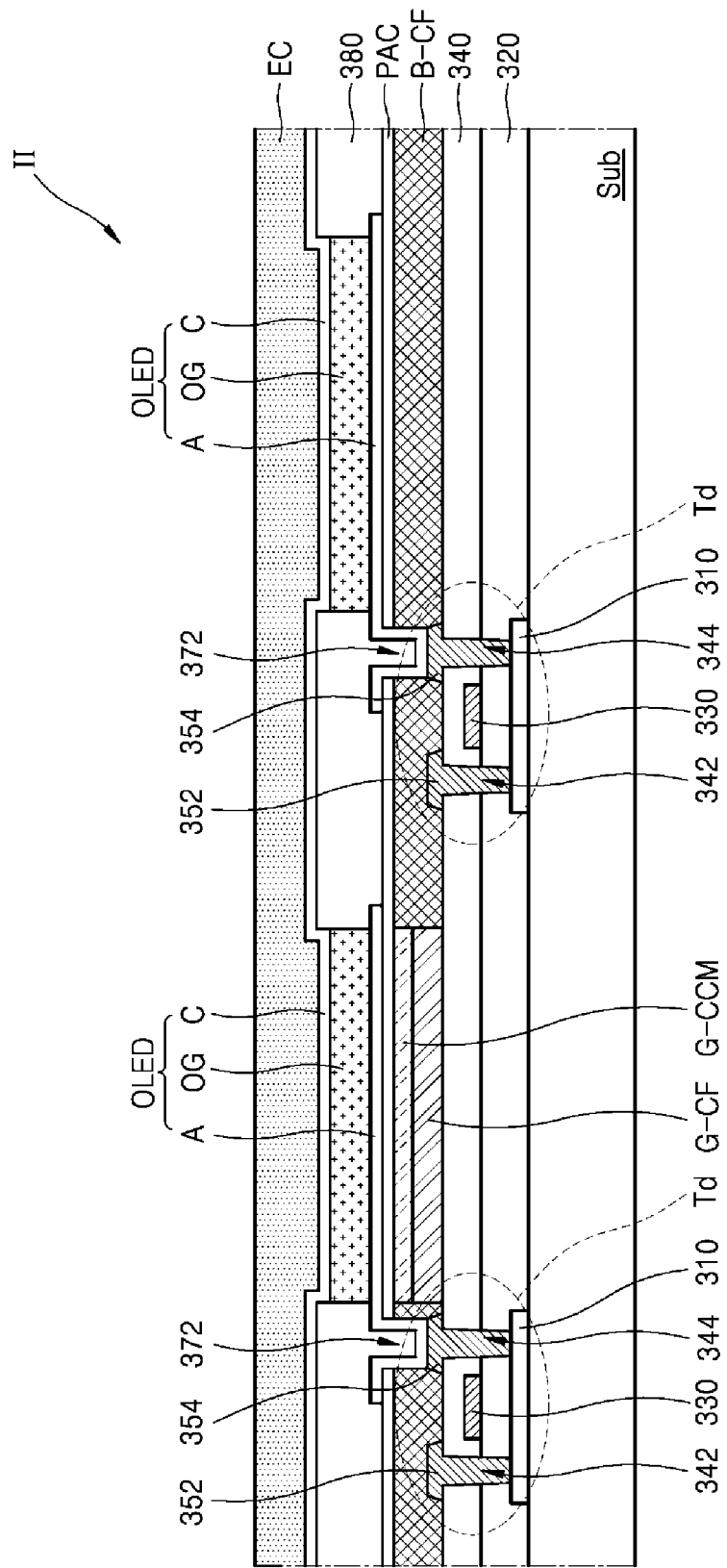
FIG. 3 is a schematic cross-sectional view illustrating region II in FIG. 1.
Figure 4:
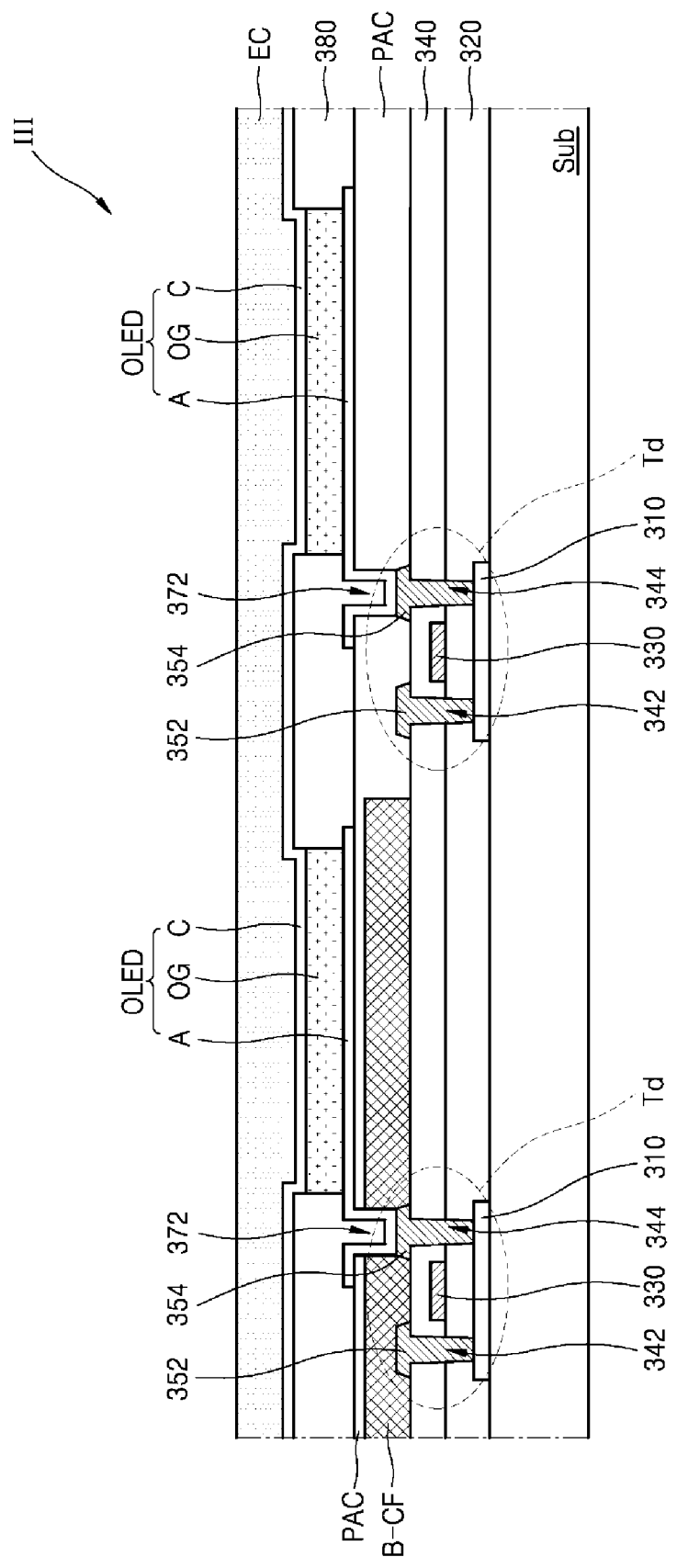
FIG. 4 is a schematic cross-sectional view illustrating region III in FIG. 1.

FIG. 2 is a schematic cross-sectional view illustrating region I in FIG. 1, FIG. 3 is a schematic cross-sectional view illustrating region II in FIG. 1, and FIG. 4 is a schematic cross-sectional view illustrating region III in FIG. 1.

The organic light-emitting device (OLED) electrically connects with a driving thin-film transistor (Td) and emits light. The organic light-emitting device (OLED) includes an anode (A), a cathode (C), and an organic film (OG). The anode (A) is disposed between a circuit board and the organic film (OG). The organic film (OG) is disposed between the circuit board and the cathode (C), and is disposed between the anode (A) and the cathode (C) in the organic light-emitting device (OLED).

Specifically, a third color filter unit (B-CF) includes a contact hole corresponding to the driving thin-film transistor (Td), and a second region of a passivation film (PAC) includes a through hole that communicates with the contact hole. The anode (A) electrically connects with the driving thin-film transistor (Td) through the contact hole and the through hole.

The self-light emitting display device 1000 has a bottom emission-type structure in which an image is implemented in a direction of the anode (A). The anode (A) may consist of light-transmitting electrodes, and the cathode (C) may consist of reflective electrodes. The light-transmitting electrodes, for instance, may consist of light-transmitting metal oxides such as ITO, IZO, ZnO and the like, and the reflective electrodes, for instance, may consist of metal such as Ag, Mg, Al, Pt, Pd, Au, Ni, Nd, Ir, Cr, Li, Ca and the like.

The organic film (OG) includes a hole transport layer (invisible), a light-emitting layer (invisible), and an electron transport layer (invisible). The hole transport layer (invisible) is disposed between the anode (A) and the light-emitting layer (invisible), the light-emitting layer (invisible) is disposed between the hole transport layer (invisible) and the electron transport layer (invisible), and the electron transport layer (invisible) is disposed between the light-emitting layer (invisible) and the cathode (C). The organic film (OG) may further include a hole injection layer (invisible). In this case, the hole injection layer (invisible) may be disposed between the anode (A) and the hole transport layer (invisible). The organic film (OG) may further include an electron injection layer (invisible). In this case, the electron injection layer (invisible) may be disposed between the electron transport layer (invisible) and the cathode (C).

The hole injection layer (invisible) may allow holes to be smoothly injected from the anode into the light-emitting layer, and for instance, may include at least one of HAT-CN, CuPu(copper phthalocyanine), PEDOT(poly(3,4)-ethylenedioxythiophene), PEDOT:PSS(poly(3,4)-ethylenedioxythiophene) poly(styrenesulfonate)), PANI(polyaniline), and NPD(N,N'-dinaphthyl-N,N'-diphenyl benzidine).

The hole transport layer (invisible) may allow holes to be smoothly transported, and for instance, may include at least one of NPD(N,N'-dinaphthyl-N,N'-diphenylbenzidine), TPD(N,N'-bis-(3-methylphenyl)-N,N'-bis-(phenyl)-benzidine), s-TAD and MTDATA(4,4',4"-Tris(N-3-methylphenyl-N-phenyl-amino)-triphenylamine).

The light-emitting layer (invisible) has a structure in which a red light-emitting layer (invisible), a green light-emitting layer (invisible), and a blue light-emitting layer (invisible) are stacked.

The electron transport layer (invisible) may allow electrons to be smoothly transported, and for instance, may include at least one of Alq3(tris(8-hydroxyquinolino)aluminum), PBD, TAZ, spiro-PBD, BAlq and SAlq.

The electron injection layer (invisible) may allow electrons to be smoothly injected, and for instance, may include at least one of Alq3(tris(8-hydroxyquinolino)aluminum), PBD, TAZ, spiro-PBD, BAlq and SAlq.

The circuit board includes the driving thin-film transistor (Td) that is disposed above the substrate (Sub). Though not illustrated, in the circuit board, a switching thin-film transistor and the like may be further disposed above the substrate (Sub). The substrate (Sub) is a transparent substrate and may be a glass substrate, a transparent polymer resin substrate and the like that are usually used. A buffer layer (invisible) may be optionally interposed between the substrate (Sub) and the driving thin-film transistor (Td) to improve flatness of the substrate (Sub). The buffer layer (invisible) may consist of inorganic oxides such as a silicon oxide and the like, inorganic nitrides such as a silicon nitride and the like, and the like.

The driving thin-film transistor (Td) is disposed above the substrate (Sub) and includes a semiconductor layer 310, a first insulation film 320, a gate electrode 330, a second insulation film 340, a source electrode 352, and a drain electrode 354.

The semiconductor layer 310 is disposed above a first region of the substrate (Sub). The semiconductor layer 310, for instance, may consist of an oxide semiconductor material or may consist of polycrystalline silicon. When the semiconductor layer 310 consists of polycrystalline silicon, the semiconductor layer 310 may include an active layer (invisible), and channel regions (invisible) that are disposed on both side of the active layer.

The first insulation film 320 is disposed between the gate electrode 330 and the substrate (Sub). A portion of the first insulation film 320 is disposed above the semiconductor layer 310 in the first region of the substrate (Sub), and another portion of the first insulation film 320 is disposed above the second region of the substrate (Sub). The first region and the second region of the substrate (Sub) are independent regions. In this specification, the first region of the substrate (Sub) may be defined as a region in which the semiconductor layer 310 is formed. The first insulation film 320 may consist of inorganic oxides such as a silicon oxide and the like, inorganic nitrides such as a silicon nitride and the like, and the like.

The gate electrode 330 is disposed above the first insulation film 320, and is disposed to be overlapped with the semiconductor layer 310 in the first region of the substrate (Sub). The gate electrode 330 may consist of aluminum-based metal such as aluminum (Al), aluminum alloys and the like, silver-based metal such as silver (Ag), silver alloys and the like, copper-based metal such as copper (Cu), copper alloys and the like, molybdenum-based metal such as molybdenum (Mo), molybdenum alloys and the like, chromium (Cr), titanium (Ti), tantalum (Ta) and the like.

The second insulation film 340 is disposed above the first insulation film 320 and the gate electrode 330. Specifically, a portion of the second insulation film 340 is disposed above the first insulation film 320, and another portion of the second insulation film 340 is disposed above the gate electrode 330. Like the first insulation film 320, the second insulation film 340 may consist of inorganic oxides such as a silicon oxide and the like, inorganic nitrides such as a silicon nitride and the like, and the like.

The source electrode 352 and the drain electrode 354 are disposed above the second insulation film 340, and are spaced apart from each other in the second insulation film 340. The source electrode 352 and the drain electrode 354 connect with the semiconductor layer 310 through the contact holes that are provided in the first insulation film 320 and the second insulation film 340. The source electrode 352 and the drain electrode 354 may consist of metal such as Al, Ag, Mg, Mo, Ti or W and the like.

The self-light emitting display device 1000 may further include the passivation film (PAC) that is disposed between the circuit board and the organic light-emitting device (OLED). The passivation film (PAC) may be provided with contact holes 372 to allow the anode (A) to contact the drain electrode 354.

A pixel defining film 380 may divide pixels and may be disposed on the passivation film (PAC) which covers the driving thin-film transistor (Td). The pixel defining film 380 may be disposed between the anode (A) and the cathode (C). The pixel defining film 380 may be patterned to expose a portion of the anode (A), and an organic film (OG) may be disposed in a partial region of the pixel defining film 380, in which a portion of the anode (A) is exposed.

An upper encapsulation substrate (EC) may be disposed above the cathode (C) and may prevent external moisture or external air and the like from infiltrating the organic film (OG) and may protect the organic film (OG) from an external impact.

A first color filter unit (R-CF) is disposed between the circuit board and the anode (A), and a first color conversion unit (R-CCM) is disposed above the first color filter unit (R-CF) between the first color filter unit (R-CF) and the anode (A). A second color filter unit (G-CF) is disposed between the circuit board and the anode (A), and a second color conversion unit (G-CCM) is disposed above the second color filter unit (G-CF) between the second color filter unit (G-CF) and the anode (A). A third color filter unit (B-CF) is disposed between the circuit board and the anode (A). Additionally, a first part of the third color filter unit (B-CF) is disposed between the first color filter unit (R-CF) and the second color filter unit (G-CF), and a second part of the third color filter unit (B-CF) is disposed between the first color conversion unit (R-CCM) and the second color conversion unit (G-CCM).

The passivation film (PAC) disposes between the thin-film transistor array (TFT array) and the organic light-emitting device (OLED) and includes the first region and the second region. The first region of the passivation film (PAC) is disposed above the first color conversion unit (R-CCM) and the second color conversion unit (G-CCM), and the second region of the passivation film (PAC) is disposed above the third color filter unit (B-CF). The passivation film (PAC) further includes a third region that is disposed above the thin-film transistor array (TFT array) in which the color layer is not formed. The third region of the passivation film (PAC) is disposed between the thin-film transistor array (TFT array) and the anode (A) and is thicker than the third color filter unit (B-CF), in a white pixel in which the color layer is not formed.

The self-light emitting display device 1000 may use the third color filter unit (B-CF) as a mold for forming a color conversion layer thereby preventing a reduction in efficiency of the color conversion layer. Conventionally, a photoresist film that contains a color conversion material is patterned to form a color conversion layer through the process of photolithography. However, due to an initiator and a photosensitive resin composition that are contained in the photoresist film, photoluminescence efficiency of the color conversion layer is reduced. The self-light emitting display device 1000 may use the third color filter unit (B-CF) as a mold for forming a color conversion layer, thereby making it possible to improve photoluminescence efficiency of the color conversion layer.

The self-light emitting display device 1000 may use the third color filter unit (B-CF) as a mold for forming a color conversion layer and may form a color conversion layer with the technology of inkjet printing. Accordingly, colors of sub-pixels may be prevented from being mixed. Conventionally, a photoresist film that contains a color conversion material is patterned through the process of photolithography to form color conversion units that generate different colors. In this case, color conversion units that have a different stack thickness respectively may be formed. Accordingly, the colors of sub-pixels may be mixed. The self-light emitting display device 1000 may use the third color filter unit (B-CF) as a mold for forming a color conversion layer and may form a color conversion layer with the technology of inkjet printing. Accordingly, the third color filter unit (B-CF) may prevent colors of adjacent sub-pixels from being mixed.

The third color filter unit (B-CF) may only transmit light in a range of blue wavelengths among input light and may absorb light outside the range of blue wavelengths. The self-light emitting display device 1000 may absorb a portion of light reflecting from metal in a region in which a metallic material such as a signal line and the like is disposed because the third color filter unit (B-CF) is formed in the entire region of the lower substrate except for the red pixel, green pixel and white pixel. As a result, the self-light emitting display device 1000 may reduce reflectivity by means of the third color filter unit (B-CF).

The aspects have been described with reference to the attached drawings. However, the present disclosure is not limited to the aspects. The disclosure may be modified in various different forms on the basis of a combination of descriptions of each aspect. It will be apparent to those having ordinary skill in the art to which the present disclosure pertains that the disclosure may be implemented in other detailed forms without modifying the technical spirit and essential features of the disclosure. Therefore, it should be understood that the above-described aspects are provided only as examples and are not construed as being limited, in all aspects.

What is claimed is:

1. A self-light emitting display device, comprising:
    a plurality of pixels arranged in a matrix form in a display area, each of which includes a first sub-pixel, a second sub-pixel and a third sub-pixel;
    a circuit board including a driving thin-film transistor corresponding to each of the first, second and third sub-pixels;
    a cathode;
    an organic film disposed between the circuit board and the cathode;
    an anode disposed between the circuit board and the organic film and corresponding to each of the first, second and third sub-pixels; and
    a color filter disposed between the circuit board and the anode;
    wherein the color filter includes:
    a first color filter unit corresponding to the first sub-pixel;
    a second color filter unit corresponding to the second sub-pixel; and
    a third color filter unit corresponding to the third sub-pixel,
    wherein the third color filter unit is further corresponding to a boundary between the first sub-pixel and the second sub-pixel,
    wherein, in the boundary between the first and second sub-pixels, the third color filter unit is disposed between the first and second color filter units,
    wherein the third color filter unit covers at least a portion of the driving thin-film transistor of each of the first, second and third sub-pixels,
    wherein, in each of the first, second and third sub-pixels, the anode is connected to the driving thin-film through a contact hole penetrating the third color filter unit, and
    wherein the third color filter unit is thicker than the first color filter unit and the second color filter unit.

2. The self-light emitting display device of claim 1, further comprising:
    a color conversion layer disposed between the color filter and the anode, wherein the color conversion layer includes:
    a first color conversion unit corresponding to the first sub-pixel and disposed over the first color filter unit, and
    a second color conversion unit corresponding to the second sub-pixel and disposed over the second color filter unit,
    wherein, in the boundary between the first and second sub-pixels, the third color filter unit is further disposed between the first and second color conversion unit.

3. The self-light emitting display device of claim 1, further comprising:
    a passivation film disposed between the color conversion layer and the anode, wherein the passivation film includes a through hole which communicates with the contact hole, and
    wherein the anode is electrically connected with the driving thin-film transistor through the through hole and the contact hole.

4. The self-light emitting display device of claim 3, wherein a portion of the passivation film is thicker than the third color filter unit.

5. A self-light emitting display device, comprising:
a plurality of pixels arranged in a matrix form in a display area, each of which includes a first sub-pixel, a second sub-pixel and a third sub-pixel;
a circuit board including a driving thin-film transistor corresponding to each of the first, second and third sub-pixels;
a cathode;
an organic film disposed between the circuit board and the cathode;
an anode disposed between the circuit board and the organic film and corresponding to each of the first, second and third sub-pixels; and
a color filter disposed between the circuit board and the anode,
wherein the color filter includes:
a first color filter unit corresponding to the first sub-pixel,
a second color filter unit corresponding to the second sub-pixel, and
a third color filter unit corresponding to the third sub-pixel,
wherein the third color filter unit is further corresponding to a boundary between the first sub-pixel and the second sub-pixel,
wherein, in the boundary between the first and second sub-pixels, the third color filter unit is disposed between the first and second color filter units,
wherein the third color filter unit covers at least a portion of the driving thin-film transistor of each of the first, second and third sub-pixels, and
wherein, in each of the first, second and third sub-pixels, the anode is connected to the driving thin-film through a contact hole penetrating the third color filter unit.

6. The self-light emitting display device of claim 5, further comprising:
a color conversion layer disposed between the color filter and the anode,
wherein the color conversion layer includes:
a first color conversion unit corresponding to the first sub-pixel and disposed over the first color filter unit, and
a second color conversion unit corresponding to the second sub-pixel and disposed over the second color filter unit,
wherein, in the boundary between the first and second sub-pixels, the third color filter unit is further disposed between the first and second color conversion unit.

7. The self-light emitting display device of claim 6, further comprising:
a passivation film disposed between the color conversion layer and the anode,
wherein the passivation film includes a through hole which communicates with the contact hole, and
wherein the anode is electrically connected with the driving thin-film transistor through the through hole and the contact hole.

8. The self-light emitting display device of claim 7, wherein a portion of the passivation film is thicker than the third color filter unit.

9. The self-light emitting display device of claim 5, wherein the third color filter unit is thicker than the first color filter unit and the second color filter unit.

10. A self-light emitting display device, comprising:
a plurality of pixels arranged in a matrix form in a display area, each of which includes a first sub-pixel, a second sub-pixel and a third sub-pixel;
a circuit board including a driving thin-film transistor corresponding to each of the first, second and third sub-pixels;
a cathode;
an organic film disposed between the circuit board and the cathode;
an anode disposed between the circuit board and the organic film and corresponding to each of the first, second and third sub-pixels;
a color conversion layer disposed between the circuit board and the anode,
wherein the color conversion layer includes a red conversion unit corresponding to the first sub-pixel, and a green conversion unit corresponding to the second sub-pixel; and
a blue filter unit corresponding to the third sub-pixel,
wherein the blue filter unit has a contact hole corresponding to a region in which the anode and the driving thin film transistor overlap each other wherein the blue filter unit is further corresponding to a boundary between the first sub-pixel and the second sub-pixel,
wherein, in the boundary between the first and second sub-pixels, the blue filter unit is disposed between the red and green conversion units,
wherein the blue filter unit covers at least a portion of the driving thin-film transistor of each of the first, second and third sub-pixels,
wherein, in each of the first, second and third sub-pixels, the anode is connected to the driving thin-film through a contact hole penetrating the blue filter unit.

11. The self-light emitting display device of claim 10, further comprising:
a passivation film disposed between the color conversion layer and the anode,
wherein the passivation film includes a through hole which communicates with the contact hole, and
wherein the anode is electrically connected with the driving thin-film transistor through the through hole and the contact hole.

12. The self-light emitting display device of claim 11, wherein a portion of the passivation film is thicker than the blue filter unit.

13. The self-light emitting display device of claim 10, wherein the blue filter unit is thicker than the red conversion unit and the green conversion unit.

* * * * *